United States Patent
Ariki et al.

Patent Number: 5,815,032
Date of Patent: Sep. 29, 1998

[54] SEMICONDUCTOR DEVICE CAPABLE OF PREVENTING FLUCTUATIONS OF SUBSTRATE POTENTIAL

[75] Inventors: Takuya Ariki; Hiroshi Akamatsu; Shigeru Mori, all of Hyogo, Japan

[73] Assignee: Mitsubishi Denki Kabushiki Kaisha, Tokyo, Japan

[21] Appl. No.: 694,440

[22] Filed: Aug. 12, 1996

[30] Foreign Application Priority Data

Feb. 6, 1996 [JP] Japan ................................ 8-019620

[51] Int. Cl.⁶ ........................................... H03K 3/01
[52] U.S. Cl. ................................... 327/534; 327/535
[58] Field of Search ........................... 327/534, 535, 327/537, 538, 541, 543, 544; 365/189.09, 226, 227; 326/27, 31, 33, 34

[56] References Cited

U.S. PATENT DOCUMENTS

| | | | |
|---|---|---|---|
| Re. 34,797 | 11/1994 | Sato et al. ................ | 365/189.09 |
| 4,961,007 | 10/1990 | Kumanoya et al. ........ | 327/537 |
| 4,985,869 | 1/1991 | Miyamoto ................. | 365/226 |
| 4,996,446 | 2/1991 | Nakada .................... | 327/427 |
| 5,065,091 | 11/1991 | Tobita ..................... | 324/158 R |
| 5,179,535 | 1/1993 | Nakayama ................ | 365/189.09 |
| 5,216,294 | 6/1993 | Ryu ......................... | 326/83 |

FOREIGN PATENT DOCUMENTS

| | | |
|---|---|---|
| 0 441 201 A2 | 1/1991 | European Pat. Off. . |
| 63-269395 A | 7/1988 | Japan . |
| 50-2883 A | 1/1993 | Japan . |
| 50-29565 A | 2/1993 | Japan . |

*Primary Examiner*—Timothy P. Callahan
*Assistant Examiner*—T. T. Lam
*Attorney, Agent, or Firm*—McDermott, Will & Emery

[57] ABSTRACT

A detect circuit receives a write enable signal, a column address strobe signal and an output control signal to predetect a mode in which data is input from an input/output terminal. While a substrate potential generation circuit normally operates, a substrate potential holding circuit also operates when the detect circuit detects the mode in which data is input, so that biasing capability of a substrate potential generating portion is increased before the data is actually input from the input/output terminal.

8 Claims, 9 Drawing Sheets

SEMICONDUCTOR DEVICE CAPABLE OF PREVENTING FLUCTUATIONS OF SUBSTRATE POTENTIAL

BACKGROUND OF THE INVENTION

1. Field of the Invention

The present invention relates to a semiconductor integrated circuit and particularly to a semiconductor integrated circuit provided with a substrate potential generation circuit.

2. Description of the Background Art

In recent years, the main stream of semiconductor integrated circuits having a DRAM (Dynamic Random Access Memory) is those having a common terminal for an input terminal and an output terminal in order to decrease the number of terminals as the number of bits of information is increased.

Figure 14:
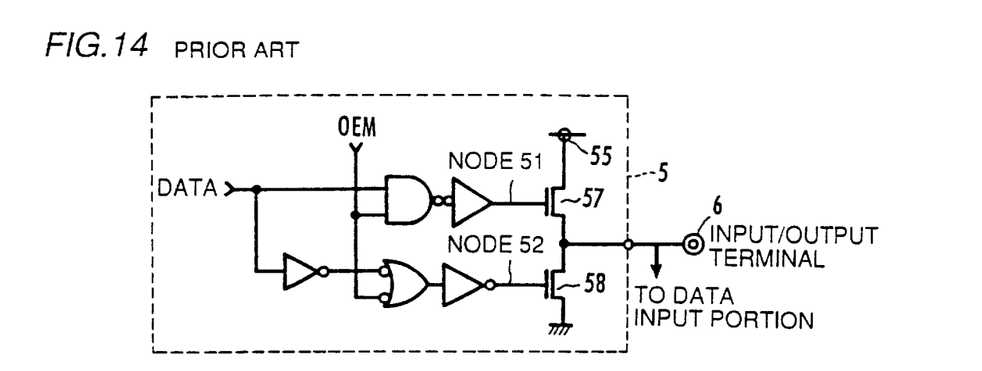
FIG. 14 is a circuit diagram of the configuration of the output buffer of a semiconductor integrated circuit having a conventional DRAM.

FIG. 14 is a circuit diagram of the configuration of an output buffer 5 of a semiconductor integrated circuit having a conventional DRAM. As shown in FIG. 14, output buffer 5 includes a power supply node 55, a ground node, and two N channel MOS transistors 57, 58 which are connected in series. When an output control signal OEM is activated, N channel MOS transistors 57, 58 are turned on or off, so that data is output from an input/output terminal 6.

When data is input, the potentials of nodes 51, 52 are typically fixed at the ground level and two N channel MOS transistors 57, 58 are turned off, (i.e., set to an Hi-Z state).

Figure 15:
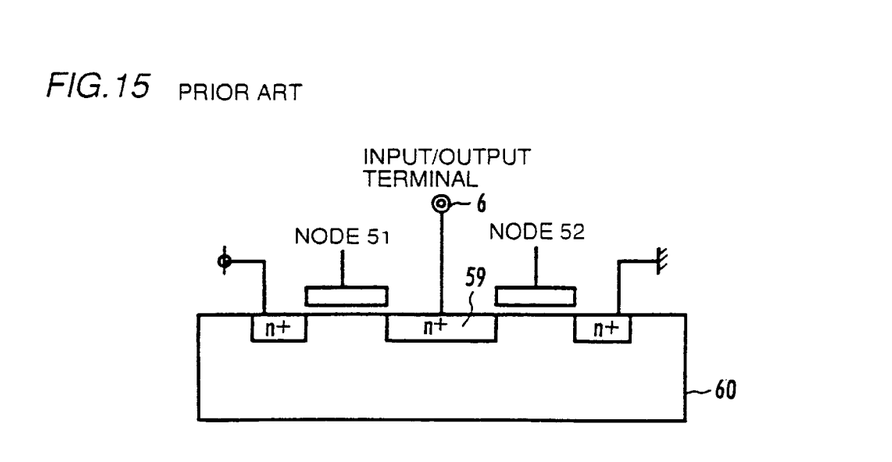
FIG. 15 is a cross sectional view of the structure of the output buffer shown in FIG. 14.

FIG. 15 is a cross sectional view of the configuration of output buffer 5. As shown in FIG. 15, output buffer 5 has a p type semiconductor substrate 60 and input/output terminal 6 with an $n^+$ layer 59 posed therebetween. If undershoot of data or the like is input to input/output terminal 6 when inputting data, transistor 57 positioned closer to the power supply is turned on and a substrate current is generated so that a substrate potential fluctuates to a positive value. Such a fluctuation of the substrate potential undesirably degrades the device characteristic of the semiconductor integrated circuit.

SUMMARY OF THE INVENTION

An object of the present invention is to provide a semiconductor integrated circuit in which a substrate potential does not fluctuate, even if undershoot of data is input to an input/output terminal when inputting data.

A semiconductor integrated circuit according to one aspect of the present invention inputs and outputs data according to an internal signal and includes a semiconductor substrate, a substrate potential generation circuit, a detect circuit and a substrate potential holding circuit. The substrate potential generation circuit generates a predetermined substrate voltage supplied to the semiconductor substrate. The detect circuit predetects a possibility of fluctuation in a substrate potential. The substrate potential holding circuit prevents the fluctuation of the substrate potential by further generating a voltage supplied to the semiconductor substrate when the detect circuit detects a possibility of the fluctuation of the substrate potential.

A semiconductor integrated circuit according to another aspect of the present invention inputs/outputs data according to an internal signal and includes a semiconductor substrate, a power supply node provided on the semiconductor substrate, an input/output terminal provided on the semiconductor substrate, at least one N channel MOS transistor connected between the power supply node and the input/output terminal, and an output control circuit. The output control circuit supplies a substrate voltage to the gate of the N channel MOS transistor when data is not output from the input/output terminal.

Thus, the main advantage of the present invention is that when a detect circuit predetects a possibility of fluctuation in a substrate potential at the time of input/output of data, a substrate potential holding circuit also operates in addition to a normally operating substrate potential generation circuit and biasing capability is increased, so that the fluctuation in the substrate potential can be prevented.

Furthermore, another advantage of the present invention is that since a substrate voltage is supplied to the gate of an N channel MOS transistor formed of an output buffer, a substrate current does not flow even if undershoot is input, thereby preventing fluctuations in a substrate potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in detail with reference to the figures. In the figures, like reference characters indicate like or corresponding portions.

[First Embodiment]

Figure 1:
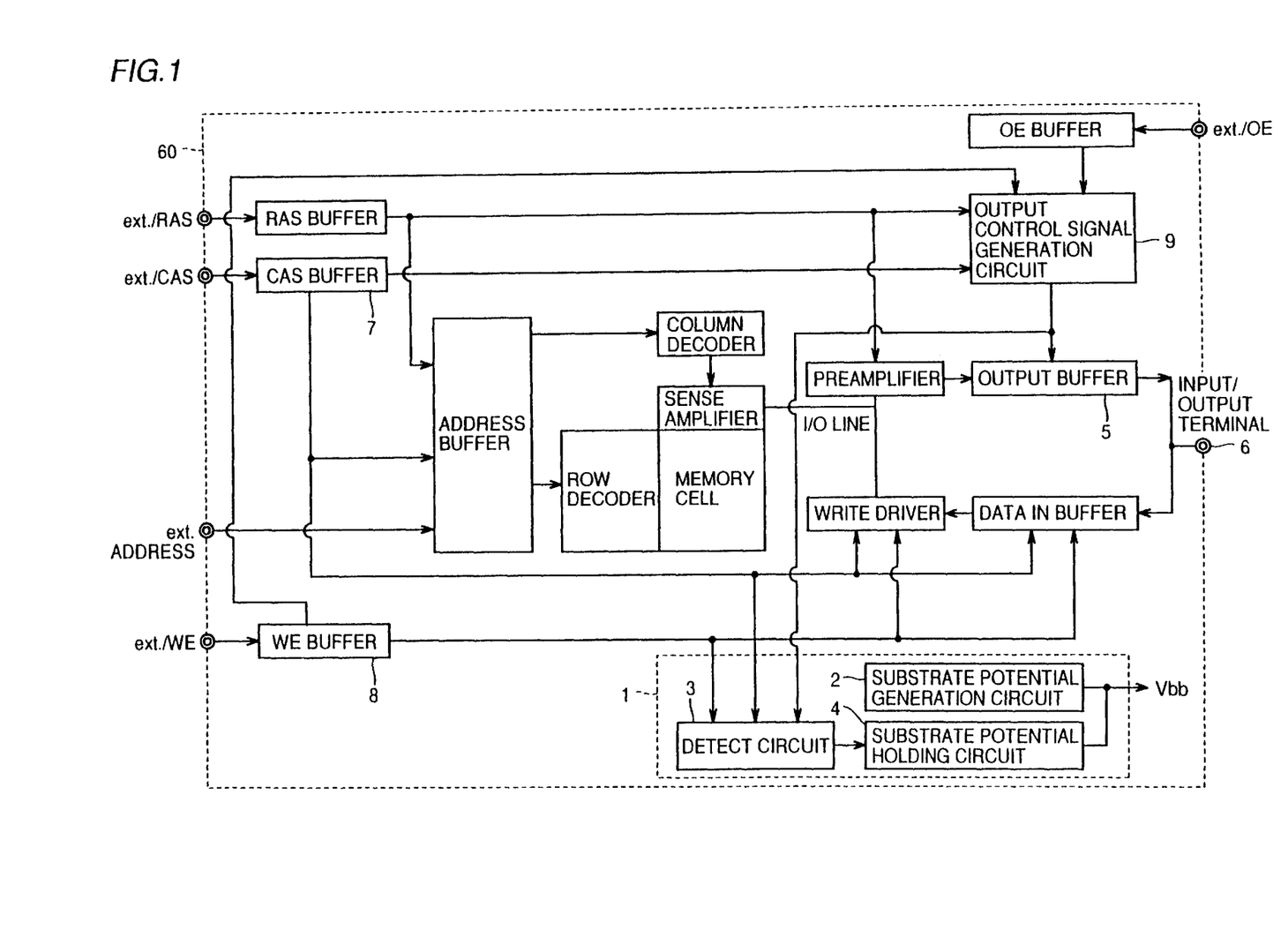
FIG. 1 is a block diagram of the entire configuration of a semiconductor integrated circuit according to a first embodiment of the present invention.

FIG. 1 shows a block diagram of the entire configuration of a semiconductor integrated circuit according to a first embodiment of the present invention. As shown in FIG. 1, a semiconductor integrated circuit according to the present embodiment is formed on a semiconductor substrate 60 and is provided with a substrate potential generating portion 1 which generates a substrate voltage Vbb supplied to semiconductor substrate 60. Substrate potential generating portion 1 further includes a detect circuit 3 and a substrate potential holding circuit 4, in addition to a substrate potential generation circuit 2 which is conventionally provided. Detect circuit 3 predetects a mode in which data is input from an input/output terminal 6 (also referred to as "a write cycle") before the data is actually input, in response to a column address strobe signal /CAS output from a CAS buffer 7, a write enable signal /W output from a WE buffer 8 and an output control signal OEM output from an output control signal generation circuit 9. When the write cycle is detected by detect circuit 3, substrate potential holding circuit 4 operates in addition to substrate potential generation circuit 2, thereby increasing biasing capability.

Figure 2:
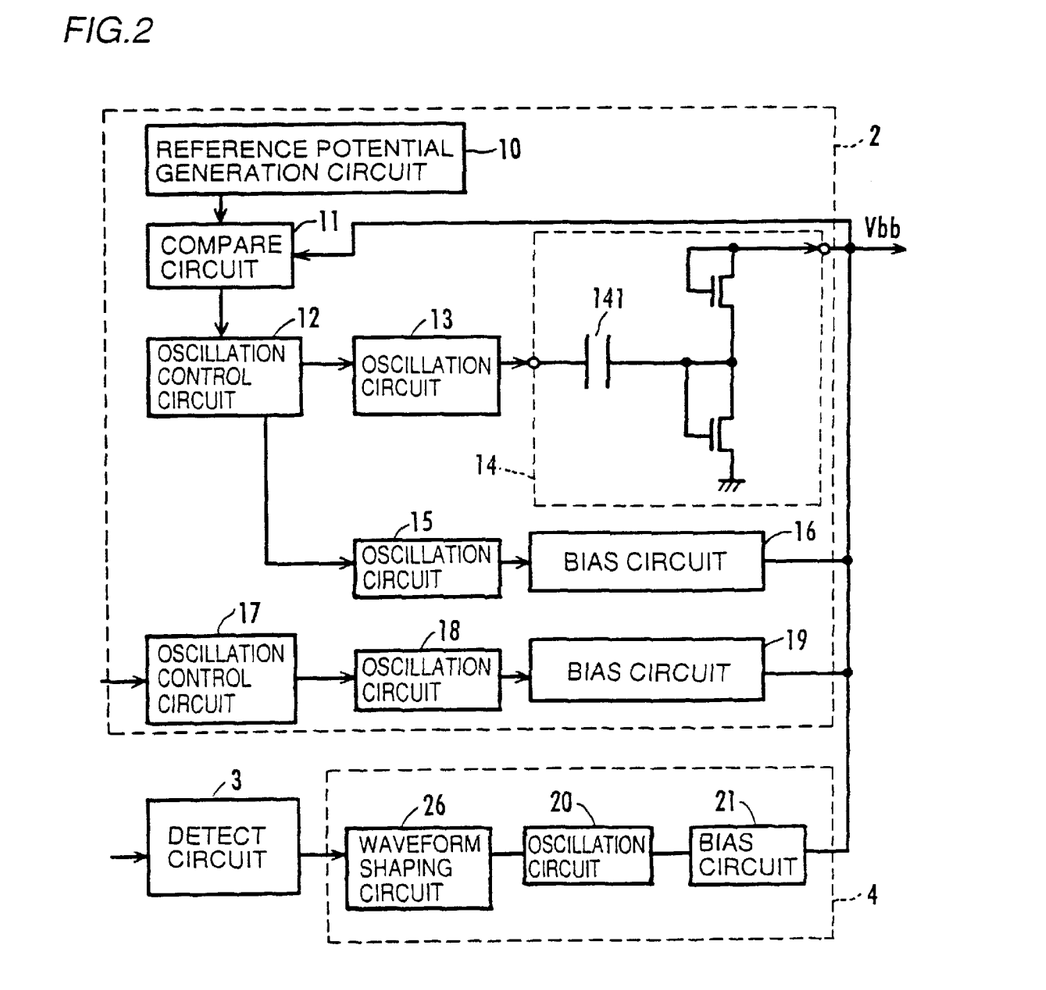
FIG. 2 is a block diagram of a specific configuration of the substrate potential generating portion of FIG. 1.

FIG. 2 is a block diagram of a specific configuration of substrate potential generating portion 1 of FIG. 1. Substrate potential generation circuit 2 is conventionally provided and includes: a reference potential generation circuit 10 generating a reference potential serving as a reference for a substrate potential; a compare circuit 11 comparing the substrate potential with the reference potential; an oscillation control circuit 12 receiving a signal from compare circuit 11 to control oscillation of an oscillation circuit 13, 15; an oscillation control circuit 17 receiving a signal such as row address strobe signal /RAS to have an oscillation circuit 18 oscillate when, for example, the semiconductor integrated circuit starts to operate; an oscillation circuit 13, 15, 18 oscillating by a ring oscillator; and a bias circuit 14, 16, 19 having pump capacitor 141 and generating substrate voltage Vbb by capacitive coupling, as shown in FIG. 2.

The biasing capabilities of bias circuits 14, 16, 19 are determined by the oscillation frequencies of corresponding oscillation circuits 13, 15, 18 and by the sizes of their respective, incorporated pump capacitor, respectively, and it is assumed that bias circuit 14 has an increased biasing capability as compared with bias circuit 16 and that bias circuit 16 has a reduced biasing capability as compared with bias circuit 14.

A semiconductor integrated circuit according to the present embodiment includes detect circuit 3 and substrate potential holding circuit 4 in addition to the above mentioned substrate potential generation circuit 2. Substrate potential holding circuit 4 includes a waveform shaping circuit 26, an oscillation circuit 20 and a bias circuit 21, and specific circuits of oscillation circuit 20 and bias circuit 21 are shown in FIG. 3.

Figure 3:
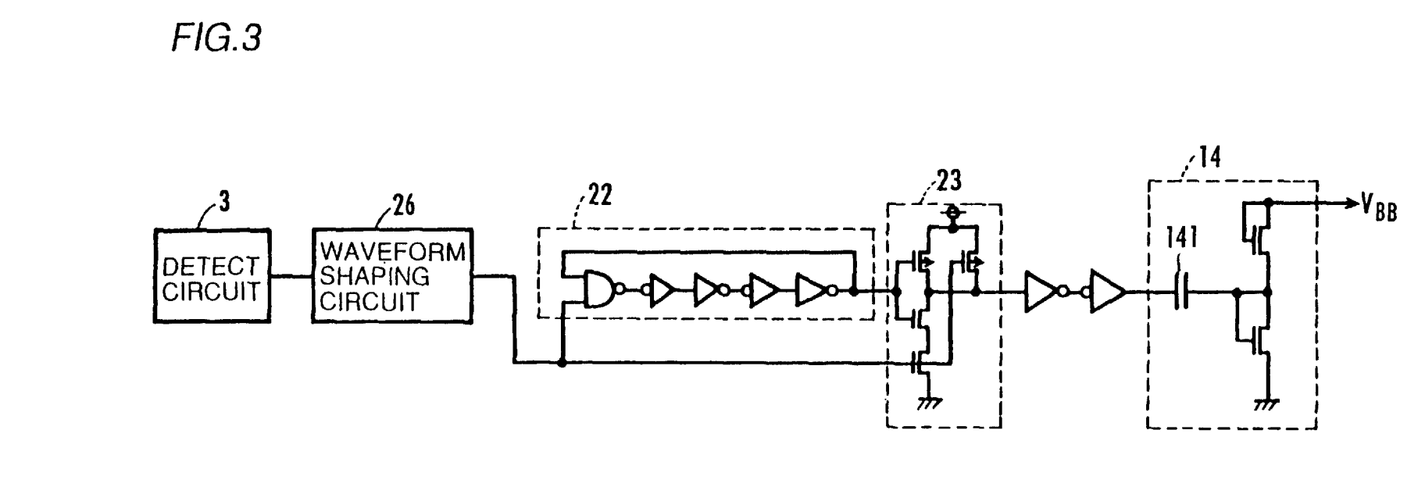
FIG. 3 is a circuit diagram of a specific configuration of the oscillation circuit and the bias circuit of FIG. 2.

A circuit shown in FIG. 3 includes a ring oscillator 22, an NAND circuit 23 and a bias circuit 14. While substrate potential generation circuit 2 operates normally, substrate potential holding circuit 4 operates only when detect circuit 3 detects a write cycle and outputs an activated, high level signal. Waveform shaping circuit 26 outputs a high level signal having a width corresponding to a period during which bias circuit 21 operates according to the signal output from detect circuit 3.

Figure 4:
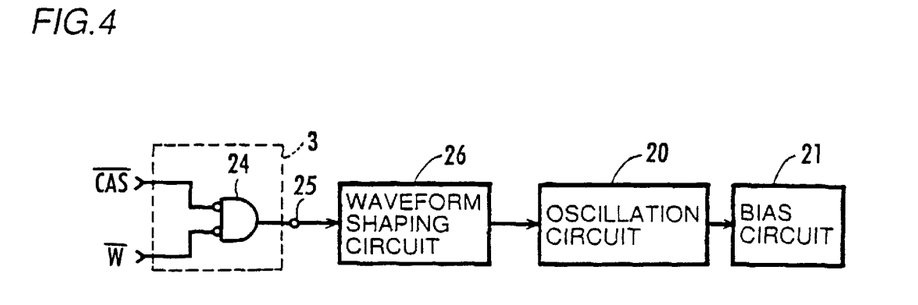
FIG. 4 shows an example of a specific configuration of the detect circuit of FIG. 1.

FIG. 4 shows an example of a specific configuration of detect circuit 3.

As shown in FIG. 4, detect circuit 3 includes an NOR circuit 24 receiving column address strobe signal /CAS and write enable signal /W as inputs.

Figure 5:
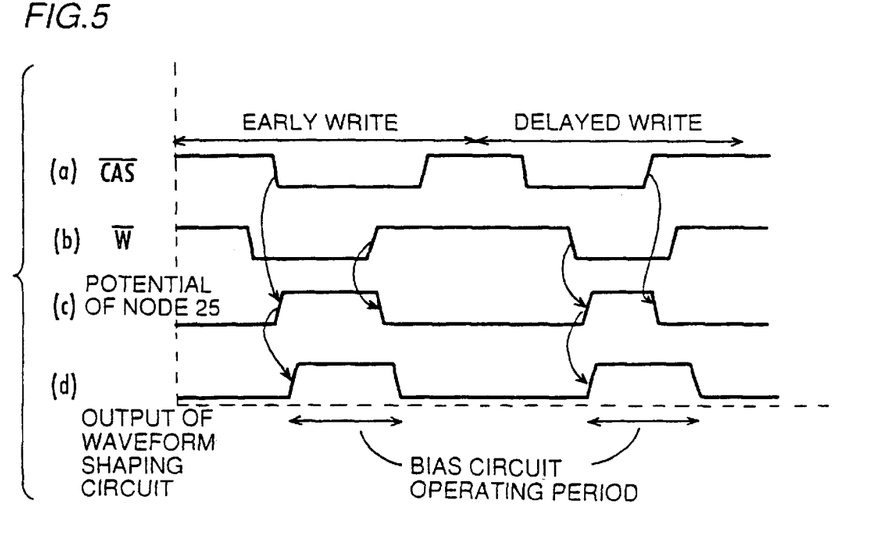
FIG. 5 is a timing chart illustrating operation of the circuit shown in FIG. 4.

Operation of the circuit shown in FIG. 4 will now be described with reference to the timing chart of FIG. 5. In a semiconductor integrated circuit according to the present embodiment, when data is input from input/output terminal 6 and is written into a memory, column address strobe signal /CAS shown in FIG. 5 at (a) and write enable signal /W shown in FIG. 5 at (b) are both activated to low level. At that time, NOR circuit 24 outputs a high level signal as shown in FIG. 5 at (c), and the signal is shaped by waveform shaping circuit 26 into a pulse having a predetermined width as shown in FIG. 5 at (d). Then, an output signal from waveform shaping circuit 26 is input to oscillation circuit 20, and bias circuit 21 operates for a period during which an output signal of oscillation circuit 20 is at high level.

According to a semiconductor integrated circuit according to the first embodiment described above, since a mode in which data is input from an input/output terminal is predetected according to internal signals and a substrate potential holding circuit as well as a normally operating substrate potential generation circuit operate to increase biasing capability, fluctuations in a substrate potential can be prevented even if undershoot occurs at the time of data input.

In the above embodiment, column address strobe signal /CAS and write enable signal /W among the internal signals are used to detect a write cycle. However, the write cycle may be detected only by write enable signal /W activated to low level when data is written into the memory. Furthermore, an inactive, output control signal OEM, which is activated when data is output from the output buffer, may be detected to operate the bias circuit.

[Second Embodiment]

Figure 6:
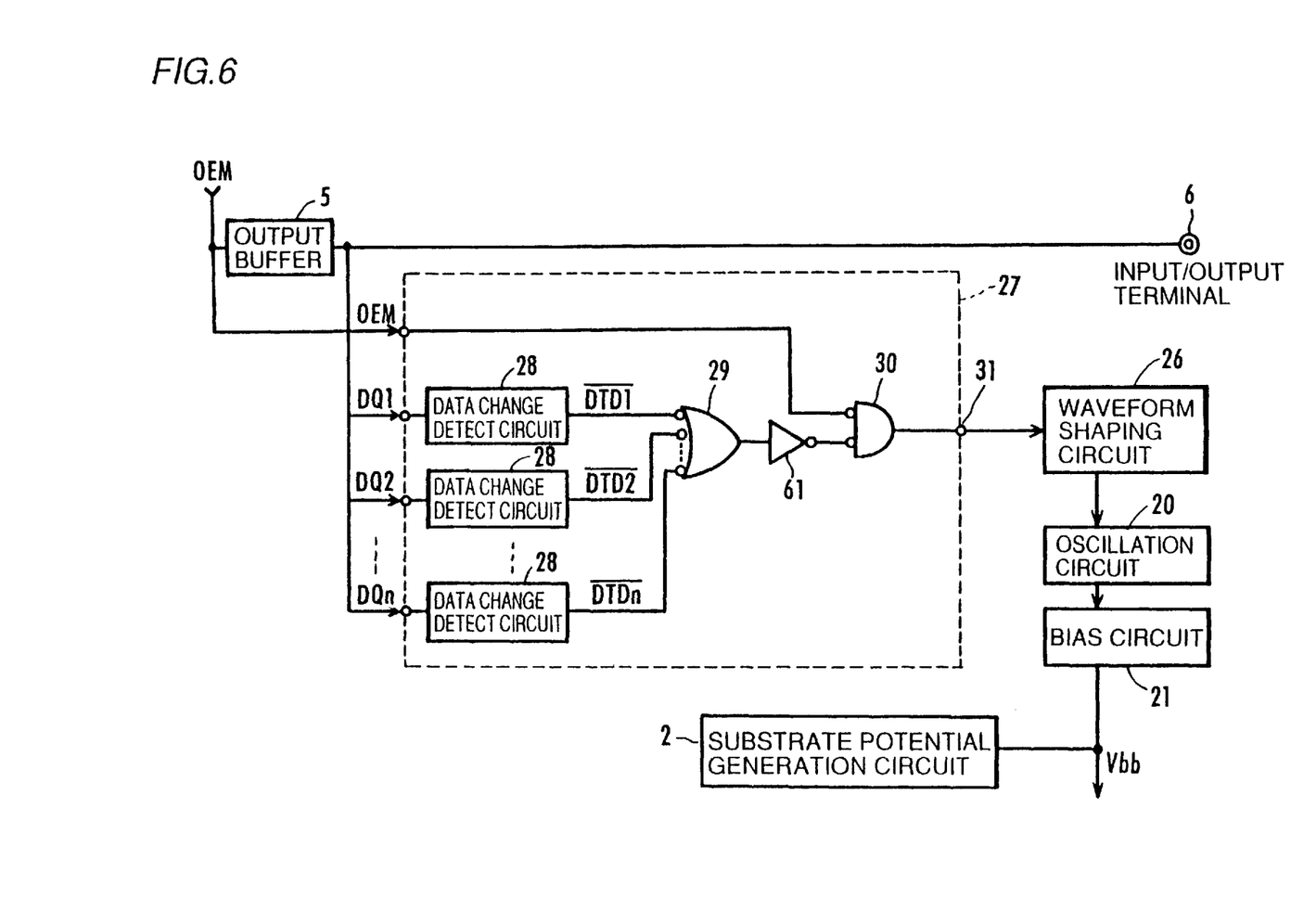
FIG. 6 shows the configuration of the substrate potential generating portion of a semiconductor integrated circuit according to a second embodiment of the present invention.

FIG. 6 shows the configuration of a substrate potential generating portion of a semiconductor integrated circuit according to a second embodiment of the present invention. As shown in FIG. 6, the substrate potential generating portion includes substrate potential generation circuit 2 generating substrate voltage Vbb, an input data change detect circuit 27, waveform shaping circuit 26, oscillation circuit 20, and bias circuit 21. Substrate potential generation circuit 2, waveform shaping circuit 26, oscillation circuit 20 and bias circuit 21 are similar to those described in the first embodiment.

Furthermore, input data change detect circuit 27 includes data change detect circuits 28 the number of which is the same as that of data simultaneously input/output from input/output terminal 6, an NAND circuit 29, an inverter 61 inverting an output signal of NAND circuit 29, and an NOR circuit 30.

Figure 7:
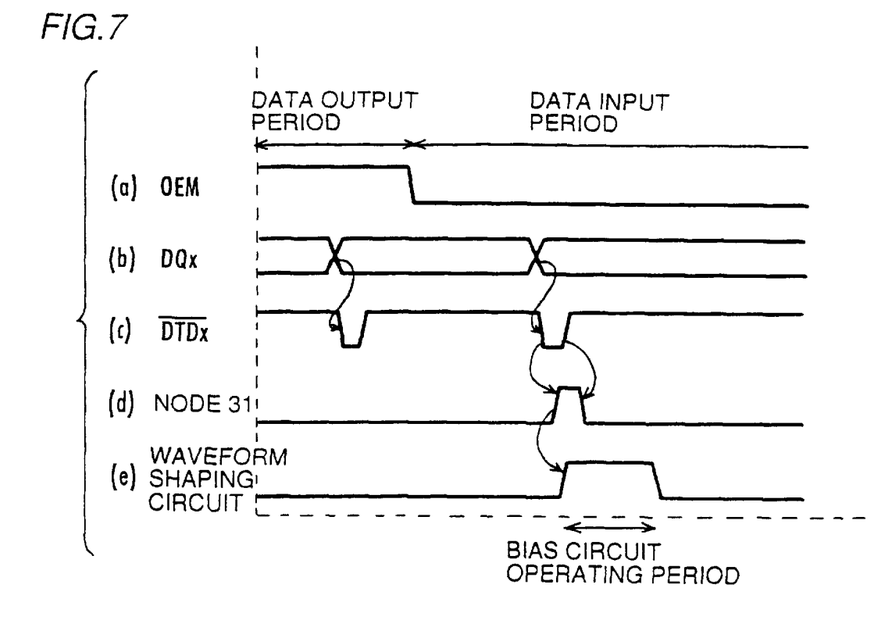
FIG. 7 is a timing chart illustrating operation of the circuit shown in FIG. 6.

Operation of the circuit shown in FIG. 6 will now be described with reference to the timing chart of FIG. 7. As shown in FIG. 7 at (a), for a high level period during which output control signal OEM is kept activated, data is output from input/output terminal 6 via output buffer 5. At that time, since the high level, output control signal OEM is input to NOR circuit 30 and an output of NOR circuit 30 is set to low level as shown in FIG. 7 at (d), input data change detect circuit 27 does not operate bias circuit 21.

On the other hand, when output control signal OEM is set to an inactive state of low level for a data input period, output buffer 5 is set to a Hi-Z state. In this state, if there is a change in logic level of data DQx (x=1 to n) of n data simultaneously input to input/output terminal 6 as shown in FIG. 7 at (b), data change detect circuit 28 outputs a pulse of low level as an output signal /DTDx as shown in FIG. 7 at (c). Thus, when the pulse of low level is output from at least one data change detect circuit 28 of n data change detect circuits 28, an output signal of NAND circuit 29 is set to high level. The output signal of NAND circuit 29 is inverted by inverter 61 and then input to NOR circuit 30. As a result, a pulse of high level is output from NOR circuit 30, as shown in FIG. 7 at (d). In synchronization with the rising of the pulse, a pulse having a predetermined width shown in FIG. 7 at (e) is formed in waveform shaping circuit 26 to be supplied to oscillation circuit 20. Thus, bias circuit 21 operates for a period corresponding to the predetermined width of the pulse.

According to a semiconductor integrated circuit according to the second embodiment, typically, when substrate voltage Vbb is supplied by a substrate potential generation circuit to a semiconductor substrate, an other bias circuit also operates according to changes in logic level of input data, so that fluctuations in a substrate potential due to undershoot of the input data can be prevented.

In the second embodiment, data change detect circuit 28 detects changes in logic level of input data from high level to low level and, inversely, from low level to high level. However, data change detect circuit 28 may only detect changes either from high level to low level or from low level to high level, of input data. For example, if a substrate potential does not fluctuate due to overshoot of input data, only input of undershoot may be predetected and data change detect circuit 28 may only detect changes in input data from high level to low level.

[Third Embodiment]

Figure 8:
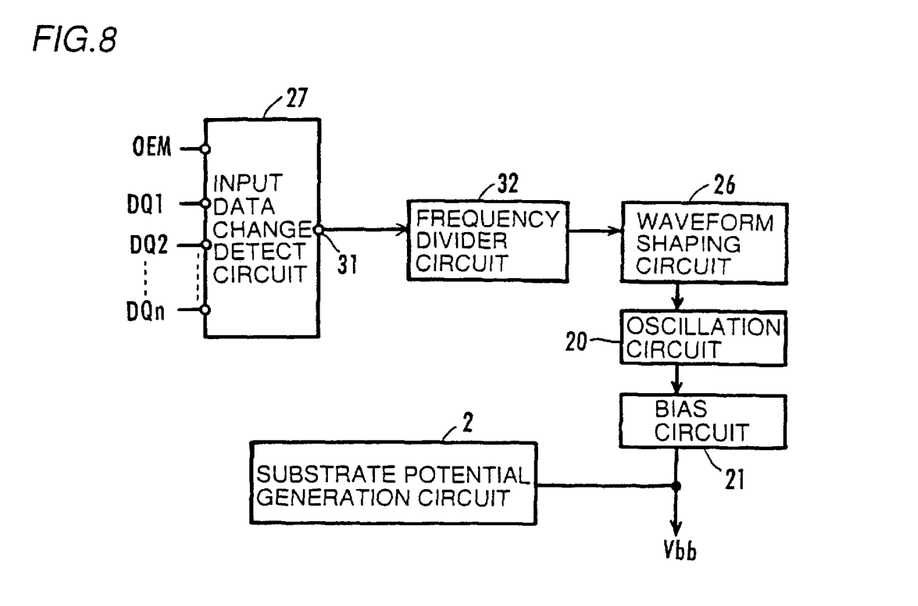
FIG. 8 shows the configuration of the substrate potential generating portion of a semiconductor integrated circuit according to a third embodiment of the present invention.

FIG. 8 shows a configuration of a substrate potential generating portion of a semiconductor integrated circuit according to a third embodiment of the present invention. As shown in FIG. 8, the substrate potential generating portion of the semiconductor integrated circuit according to the third embodiment has a similar configuration to that of the substrate potential generating portion of the semiconductor integrated circuit according to the second embodiment, but differs in that it includes a frequency divider circuit 32 outputting a pulse the frequency of which is lower than that of an input pulse between input data change detect circuit 27 and waveform shaping circuit 26.

Figure 9:
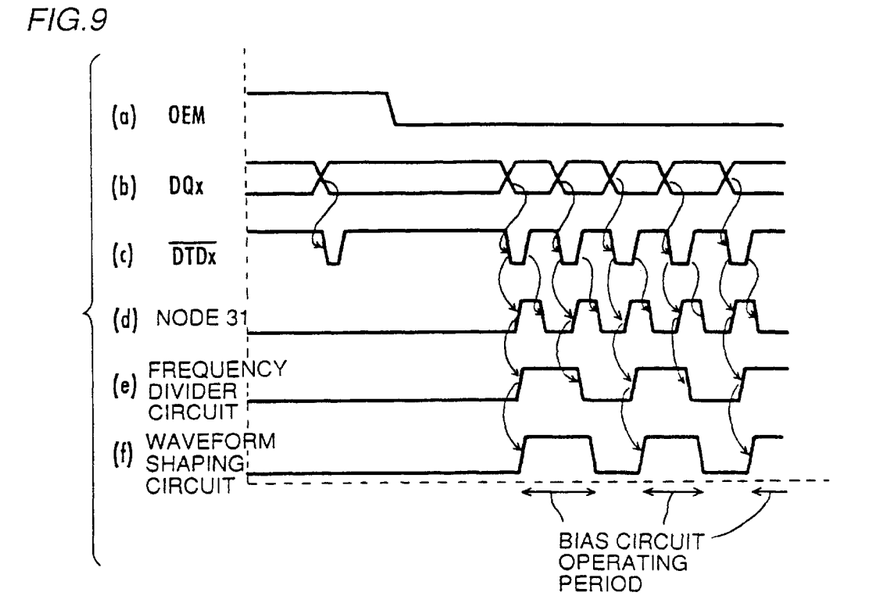
FIG. 9 is a timing chart illustrating operation of the circuit shown in FIG. 8.

Operation of the substrate potential generating portion will now be described with reference to the timing chart of FIG. 9. When changes in data detected by input data change detect circuit 27 are less frequent, the substrate potential generating portion operates in the same manner as the second embodiment. However, when changes in logic level of input data is more frequent as shown in FIG. 9 at (b), input data change detect circuit 27 outputs pulses having high frequency as shown in FIG. 9 at (d). At that time, frequency divider circuit 32 outputs such a pulse that its output signal rises to high level synchronously with the rising of an input pulse and falls to low level synchronously with the rising of the next input pulse. As a result, frequency divider circuit 32 outputs to waveform shaping circuit 26 a signal which would be output when changes in data are less frequently detected by input data change detect circuit 27, and this is effective when, in operation, waveform shaping circuit 26 and oscillation circuit 20 cannot track an input signal having a high frequency.

In a semiconductor integrated circuit according to the third embodiment, when biasing capability of a substrate potential generating portion is increased according to a change in logic level of input data, a bias circuit which additionally operates can operate optimally even when data changes frequently.

[Fourth Embodiment]

Figure 10:
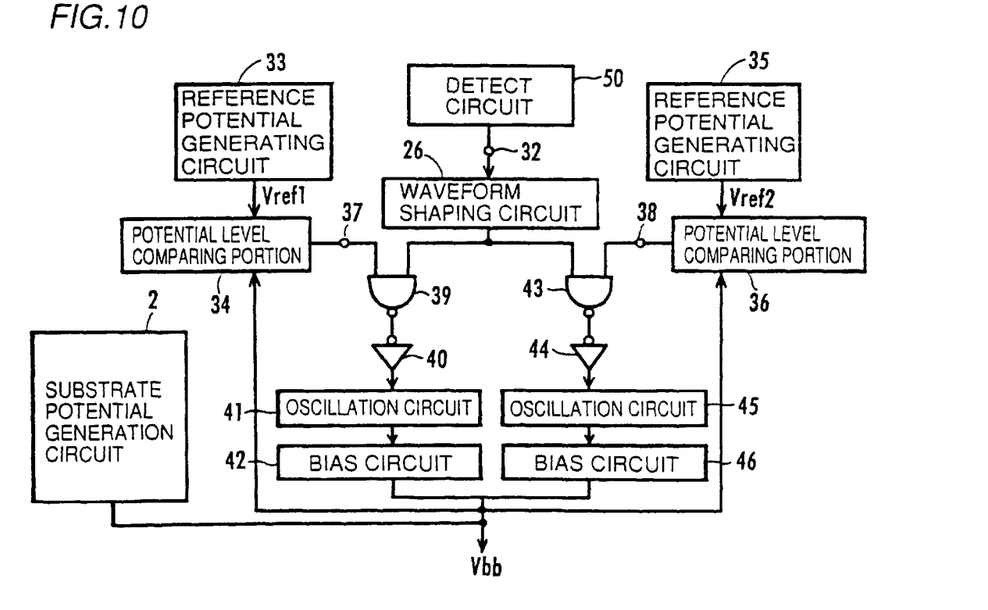
FIG. 10 shows the configuration of the substrate potential generating portion of a semiconductor integrated circuit according to a fourth embodiment of the present invention.

FIG. 10 shows a configuration of a substrate potential generating portion of a semiconductor integrated circuit according to a fourth embodiment of the present invention. As shown in FIG. 10, the substrate potential generating portion, while having the similar configuration to those shown in the first to third embodiments, furthermore includes a reference potential generating portion 33 generating a reference voltage $V_{ref1}$ serving as a reference for substrate voltage Vbb, a potential level comparing portion 34 comparing a substrate potential with reference voltage $V_{ref1}$, an NAND circuit 39 receiving an output signal of potential level comparing portion 34 and an output signal from waveform shaping circuit 26 as inputs and an inverter 40 inverting an output signal from NAND circuit 39, and further includes a reference potential generating portion 35 generating a reference voltage $V_{ref2}$, a potential level comparing portion 36 comparing the substrate potential with reference voltage $V_{ref2}$, an NAND circuit 43 receiving an output signal from potential level comparing portion 36 and an output signal from waveform shaping circuit 26 as inputs, and an inverter 44 inverting an output signal from NAND circuit 43. A detect circuit 50 corresponds to detect circuit 3 according to the first embodiment or to input data change detect circuit 27 according to the second and third embodiments.

Figure 11:
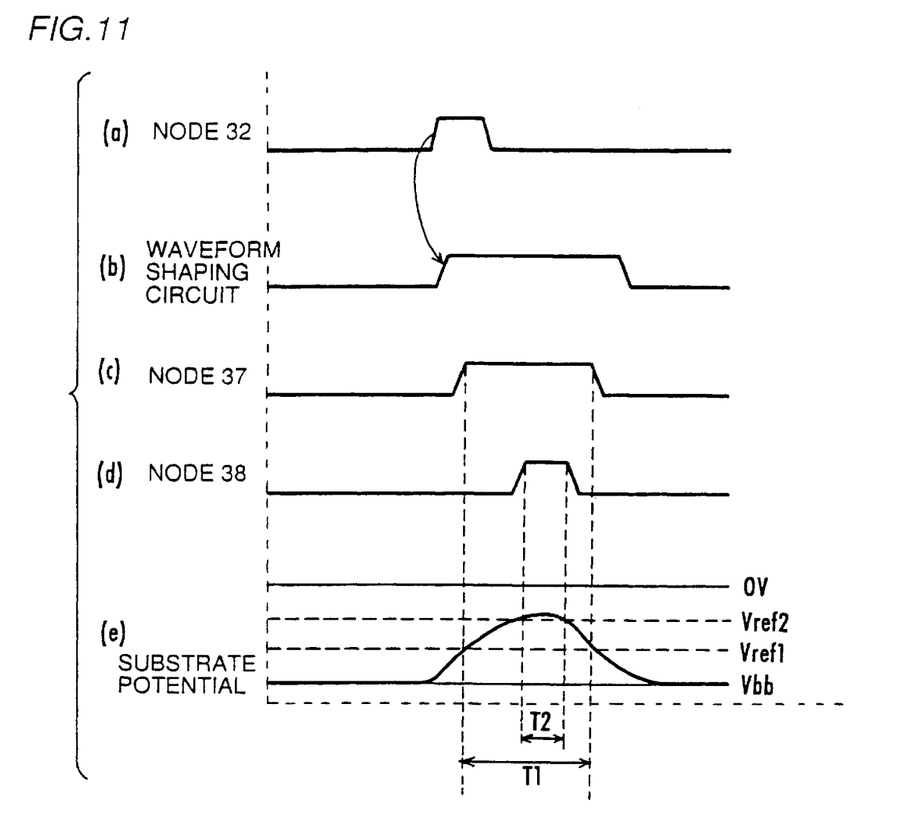
FIG. 11 is a timing chart illustrating the operation of the circuit shown in FIG. 10.

Operation of the substrate potential generating portion will now be described with reference to the timing diagram of FIG. 11. As shown in FIG. 11 at (a), detect circuit 50 detects a possibility of fluctuation in a substrate potential, a high level pulse is output, and in synchronization with the rising of the pulse, a pulse having a predetermined width shown in FIG. 11 at (b) is output from waveform shaping circuit 26. At that time, if the substrate potential is increased from potential voltage Vbb, as shown in FIG. 11 at (e), due to undershoot of data input from the input/output terminal or the like, potential level comparing portion 34 compares the substrate potential with reference voltage $V_{ref1}$ generated at reference potential generating portion 33, and if the substrate potential is greater than reference voltage $V_{ref1}$ then potential level comparing portion 34 outputs a high level pulse as shown in FIG. 11 at (c). Then, since two high level signals are input to NAND circuit 39, it outputs a low level signal. Thus, a high level signal from inverter 40 is input to oscillation circuit 41, and as a result, bias circuit 42 operates in addition to substrate potential generation circuit 2 for a period $T_1$ during which the substrate potential is higher than $V_{ref1}$. However, when the substrate potential still increases in spite of the operation of bias circuit 42 and the substrate potential becomes higher than a reference voltage $V_{ref2}$ generated by reference potential generating portion 35, potential level comparing portions 36 outputs a high level pulse, as shown in (d) and (e) of FIG. 11. Then, NAND circuit 43 outputs a low level signal, and as a result, bias circuit 46 also operates for a period $T_2$ during which the substrate potential exceeds reference voltage $V_{ref2}$.

According to a semiconductor integrated circuit according the fourth embodiment, since bias capability of a substrate potential generating portion is increased according to fluctuations in a substrate potential, the substrate potential can be quickly returned to the predetermined substrate voltage Vbb even when the substrate potential fluctuates. Furthermore, since a bias circuit can additionally operate only when the substrate potential actually increases, power consumption can be reduced.

Furthermore, while two reference potential generating portions and two potential level comparing portions are provided in the fourth embodiment, it is also possible to provide one or three or more reference potential generating portions and one or three or more potential level comparing portions.

[Fifth Embodiment]

Figure 12:
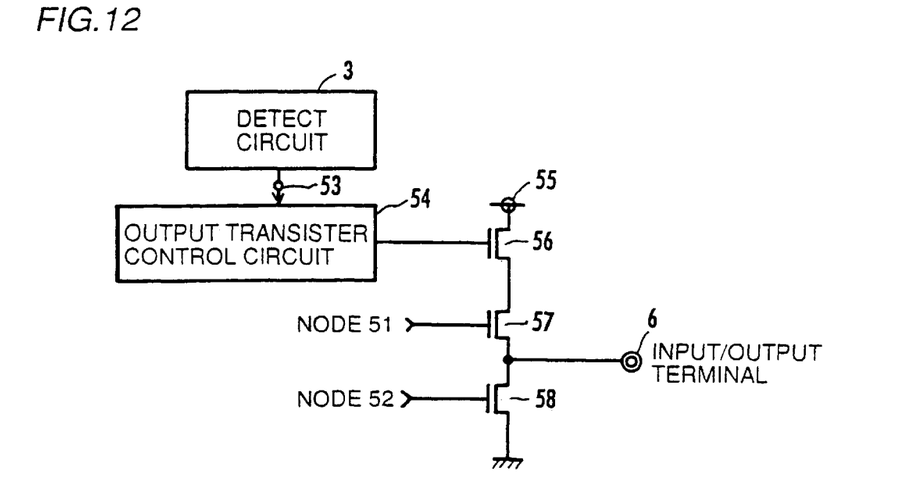
FIG. 12 shows the configuration of a semiconductor integrated circuit according to a fifth embodiment of the present invention.

FIG. 12 shows the configuration of a semiconductor integrated circuit according to a fifth embodiment of the present invention. As shown in FIG. 12, the semiconductor integrated circuit according to the fifth embodiment is formed on semiconductor substrate 60 and includes: power supply node 55 and input/output terminal 6 provided on semiconductor substrate 60; N channel MOS transistor 58 having its source connected to a ground node, its drain connected to input/output terminal 6, and its gate connected to node 52; N channel MOS transistor 57 having its source connected to input/output terminal 6, and its gate connected to node 51; an N channel MOS transistor 56 having its source connected to the drain of N channel MOS transistor 57, and its drain connected to power supply node 55; detect circuit 3 detecting a predetermined logic level of an internal signal indicating data input; and an output transistor control circuit 54 outputting a boosted level signal when an inactive, low level signal from detect circuit 3 is input thereto, and outputting a substrate voltage Vbb level signal when an active, high level signal from detect circuit 3 is input thereto. Detect circuit 3 is similar to that described in the first embodiment, and power supply node 55, N channel MOS transistors 57, 58 and input/output terminal 6 configure output buffer 5 which is conventionally provided.

Operation of the circuit shown in FIG. 12 will now be described with reference to the timing diagram of FIG. 13. when detect circuit 3 predetects a possibility of fluctuation in a substrate potential, it outputs a high level signal shown in FIG. 13 at (a), and accordingly a signal of substrate voltage Vbb level shown in FIG. 13 at (b) is supplied from output transistor control circuit 54 to the gate of N channel MOS transistor 56. This allows N channel MOS transistor 56 to turn off, and a substrate current does not flow from power supply node 55 to the ground node even if undershoot occurs in data input from input/output terminal 6. That is, since a signal of substrate voltage Vbb level is supplied to the gate of N channel MOS transistor 56, N channel MOS transistor 56 is not turned on even if undershoot the absolute value of which is larger than that of threshold voltage Vth of N channel MOS transistors 56, 57 is input to input/output terminal 6 and if the undershoot has a potential equal to or more than the result of substrate voltage Vbb minus threshold voltage Vth, and consequently the substrate current from power supply node 55 does not flow to the ground node.

Figure 13:
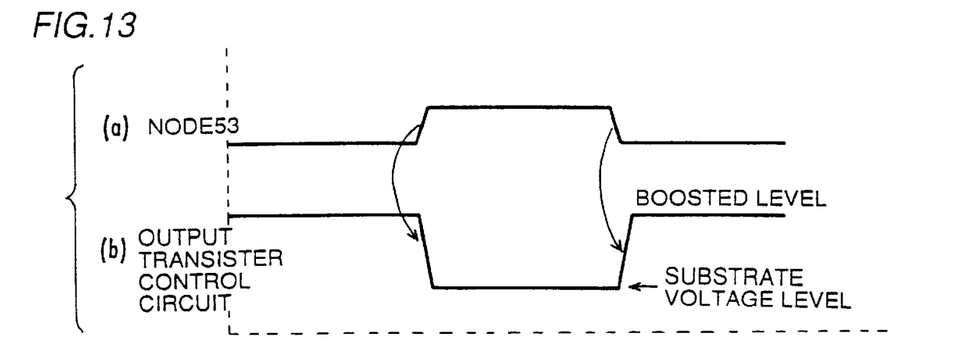
FIG. 13 is a timing chart illustrating operation of the circuit shown in FIG. 12.

When detect circuit 3 does not detect the possibility of fluctuation in the substrate potential, it outputs a low level signal and output transistor control circuit 54 therefore outputs a boosted level signal as shown in FIG. 13 at (b) so that N channel MOS transistor 56 is turned on.

In a semiconductor integrated circuit according to the fifth embodiment, a substrate current does not flow even if undershoot equal to or greater than the result of substrate voltage Vbb minus threshold voltage Vth is input, so that fluctuations in a substrate potential can be prevented.

While an output signal of output control circuit 54 is input to the gate of N channel MOS transistor 56 in the semiconductor integrated circuit according to the fifth embodiment, it may be directly input to the gate of N channel MOS transistor 57.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit inputting/outputting data in response to an internal signal, comprising:

a semiconductor substrate;

substrate voltage generating means for generating a predetermined potential to be supplied to said semiconductor substrate;

detecting means for detecting a change in logic level of input data; and substrate potential holding means for generating a voltage to be supplied to said semiconductor substrate in response to detection of a change in said detecting means thereby to prevent fluctuation in the potential of said semiconductor substrate.

2. The semiconductor integrated circuit according to claim 1, wherein said detecting means detects a predetermined logic level of an internal signal indicating data input.

3. The semiconductor integrated circuit according to claim 1, further comprising:

an output buffer outputting data; and output controlling means for supplying an activated, output control signal to said output buffer, thereby controlling said output buffer to output the data, wherein said detecting means detects changes in logic level of said input data only when said output control signal is inactive.

4. The semiconductor integrated circuit according to claim 1, further comprising frequency dividing means for dividing the frequency of said change in logic level.

5. The semiconductor integrated circuit according to claim 2, further comprising:

reference potential generating means for generating a reference potential to maintain the potential of said semiconductor substrate; and potential level comparing means for comparing the potential of said semiconductor substrate with said reference potential, said substrate potential holding means operates only when it is determined in said potential level comparing means that the potential of said semiconductor substrate is greater than said reference potential.

6. The semiconductor integrated circuit according to claim 1, further comprising:

reference potential generating means for generating a reference potential to maintain the potential of said semiconductor substrate; and potential level comparing means for comparing the potential of said semiconductor substrate with said reference potential, said substrate potential holding means operates when said potential level comparing means determines that the potential of said semiconductor substrate is greater than said reference potential.

7. The semiconductor integrated circuit according to claim 3, further comprising:

reference potential generating means for generating a reference potential to maintain the potential of said semiconductor substrate; and potential level comparing means for comparing the potential of said semiconductor substrate with said reference potential, said substrate potential holding means operates only when it is determined in said potential level comparing means that the potential of said semiconductor substrate is greater than said reference potential.

8. The semiconductor integrated circuit according to claim 4, further comprising:

reference potential generating means for generating a reference potential to maintain the potential of said semiconductor substrate; and potential level comparing means for comparing the potential of said semiconductor substrate with said reference potential, said substrate potential holding means operates only when it is determined in said potential level comparing means that the potential of said semiconductor substrate is greater than said reference potential.

* * * * *